(12) United States Patent
Popovici et al.

(10) Patent No.: US 10,415,132 B2
(45) Date of Patent: Sep. 17, 2019

(54) METAL OXIDE-POLYMER LAMINATE AND PRODUCTION METHOD THEREOF

(71) Applicant: NITTO DENKO CORPORATION, Ibaraki-shi Osaka (JP)

(72) Inventors: Daniel Popovici, Ibaraki (JP); Keita Mine, Ibaraki (JP); Masayuki Minakata, Ibaraki (JP); Toshitaka Nakamura, Ibaraki (JP)

(73) Assignee: NITTO DENKO CORPORATION, Ibaraki-shi, Osaka (JP)

( * ) Notice: Subject to any disclaimer, the term of this patent is extended or adjusted under 35 U.S.C. 154(b) by 235 days.

(21) Appl. No.: 15/209,944

(22) Filed: Jul. 14, 2016

(65) Prior Publication Data

US 2016/0319420 A1    Nov. 3, 2016

Related U.S. Application Data

(62) Division of application No. 14/553,286, filed on Nov. 25, 2014, now abandoned.

(30) Foreign Application Priority Data

Nov. 27, 2013  (JP) .................................. 2013-244625

(51) Int. Cl.
*C23C 14/22* (2006.01)
*C23C 14/08* (2006.01)
(Continued)

(52) U.S. Cl.
CPC ................ *C23C 14/22* (2013.01); *B05D 1/10* (2013.01); *B05D 1/12* (2013.01); *C23C 14/083* (2013.01);
(Continued)

(58) Field of Classification Search
CPC ....... C23C 14/083; C23C 14/22; C23C 14/58; C23C 24/04; Y10T 428/24999;
(Continued)

(56) References Cited

U.S. PATENT DOCUMENTS 6,004,667 A    12/1999  Sakurada
7,547,393 B2    6/2009  Ramaswamy et al.
(Continued)

FOREIGN PATENT DOCUMENTS

CN    103551171 A  *  2/2014
DE    102004038795 A1    3/2006
(Continued)

OTHER PUBLICATIONS

Communication dated Mar. 5, 2018 from the European Patent Office in counterpart application No. 14 194 470.2.
(Continued)

*Primary Examiner* — William P Fletcher, III
(74) *Attorney, Agent, or Firm* — Sughrue Mion, PLLC

(57) ABSTRACT

A method for producing a metal oxide-polymer laminate, including preparing a polymer layer, and forming a metal oxide layer on a surface of the polymer layer by an aerosol deposition method so that at least a portion of the metal oxide layer is embedded in the polymer layer in a thickness direction thereof.

5 Claims, 1 Drawing Sheet

(51) Int. Cl.
  *B05D 1/12* (2006.01)
  *B05D 1/10* (2006.01)
  *C23C 24/04* (2006.01)
  *C23C 14/58* (2006.01)

(52) U.S. Cl.
  CPC .............. *C23C 14/58* (2013.01); *C23C 24/04* (2013.01); *B05D 2201/02* (2013.01); *B05D 2201/04* (2013.01); *B05D 2201/06* (2013.01); *Y10T 428/24999* (2015.04); *Y10T 428/249986* (2015.04); *Y10T 428/256* (2015.01)

(58) Field of Classification Search
  CPC ...... Y10T 428/249986; Y10T 428/256; B05D 1/10; B05D 1/12; B05D 2201/02; B05D 2201/04; B05D 2201/06
  See application file for complete search history.

(56) References Cited

U.S. PATENT DOCUMENTS

| | | | |
|---|---|---|---|
| 7,632,539 B2 * | 12/2009 | Miyake | G03G 5/08 427/160 |
| 2002/0071905 A1 | 6/2002 | Akedo | |
| 2007/0110919 A1 * | 5/2007 | Ballhorn | C23C 24/04 427/569 |
| 2010/0304063 A1 | 12/2010 | McCrea | |
| 2012/0237789 A1 * | 9/2012 | Wang | C25D 5/54 428/626 |
| 2012/0308807 A1 | 12/2012 | Edwards | |
| 2013/0280414 A1 | 10/2013 | Fuchita et al. | |

FOREIGN PATENT DOCUMENTS

| | | | |
|---|---|---|---|
| JP | 59145219 A * | 8/1984 | |
| JP | 2001-3180 A | 1/2001 | |
| JP | 2006-128229 A | 5/2006 | |
| JP | 2009-202129 A | 9/2009 | |
| JP | 2009-301825 A | 12/2009 | |
| JP | 2012-216684 A | 11/2012 | |
| KR | 10200500009397 A * | 7/2006 | |
| WO | 02/47898 A1 | 6/2002 | |

OTHER PUBLICATIONS

Hanft et al., "An Overview of the Aerosol Deposition Method: Process Fundamentals and New Trends in Materials Applications", Journal of Ceramic Science and Technology, vol. 6, No. 3, 2015, pp. 147-181.

Notification of the Second Office Action dated Nov. 23, 2017 from the State Intellectual Property Office of the P.R.C. in counterpart application No. 201410674343.6.

Notification of Reasons for Refusal dated Jun. 20, 2017, issued by the Japanese Patent Office in counterpart application No. 2013-244625.

Extended European Search Report dated May 7, 2015 from the European Patent Office in counterpart application No. 14194470.2.

Notification of First Office Action dated Jun. 1, 2017 from the State Intellectual Property Office of P.R China in counterpart application 201410674343.6.

Notification of Third Office Action dated May 25, 2018 from the State Intellectual Property Office of the P.R.C. in counterpart application No. 201410674343.6.

Decision of Rejection dated Aug. 31, 2018 from the State Intellectual Property Office of the P.R.C. in counterpart Chinese application No. 201410674343.6.

Notification of Reexamination dated Jul. 8, 2019, issued by the China National Intellectual Property Administration in corresponding Chinese Application No. 201410674343.6.

* cited by examiner

METAL OXIDE-POLYMER LAMINATE AND PRODUCTION METHOD THEREOF

CROSS-REFERENCE TO RELATED APPLICATION

This is a divisional of application Ser. No. 14/553,286, filed Nov. 25, 2014, which claims priority from Japanese Patent Application No. 2013-244625 filed on Nov. 27, 2013, the contents of which are hereby incorporated by reference into this application.

BACKGROUND OF THE INVENTION

Field of the Invention

The present invention relates to a metal oxide-polymer laminate and a production method thereof.

Description of Related Art

Metal oxide-polymer laminates including a polymer layer and a metal oxide layer laminated thereon have been widely used for application in substrates for electronic components, flexible electronic devices, electrooptic devices, sensor components, medical devices, and as membranes in gas-liquid separation modules (for example, see Japanese Unexamined Patent Publication No. 2012-216684, Japanese Unexamined Patent Publication No. 2006-128229, and U.S. Pat. No. 7,547,393).

The metal oxide-polymer laminates can be produced, for example, by heat pressing a metal oxide layer onto a polymer layer, or by injection of ceramic particles in the thickness direction of a polymer layer.

SUMMARY OF THE INVENTION

However, in metal oxide-polymer laminates formed with methods as described in prior art, adhesive strength at the interface between the metal oxide layer and the polymer layer is insufficient, and localized peeling or separation of the two layers on a larger scale can easily occur.

An object of the present invention is to provide a metal oxide-polymer laminate having improved adhesive strength at the interface between the metal oxide layer and the polymer layer, and a production method thereof.

A metal oxide-polymer laminate of the present invention includes a polymer layer, and a metal oxide layer laminated on a surface of the polymer layer and formed by an aerosol deposition method, wherein at least a portion of the metal oxide layer is embedded in the polymer layer in a thickness direction thereof.

In the metal oxide-polymer laminate of the present invention, it is preferable that the metal oxide layer is formed by the aerosol deposition method using an aggregate of metal oxide particles.

In the metal oxide-polymer laminate of the present invention, it is preferable that the aggregate of metal oxide particles has a median diameter of 0.5 μm or more and 10 μm or less.

In the metal oxide-polymer laminate of the present invention, it is preferable that the polymer layer is a porous layer.

A method for producing a metal oxide-polymer laminate includes the steps of: preparing a polymer layer, and forming a metal oxide layer on a surface of the polymer layer by an aerosol deposition method so that at least a portion of the metal oxide layer is embedded in the polymer layer in a thickness direction thereof.

In the metal oxide-polymer laminate of the present invention, adhesive strength at the interface between the metal oxide layer and the polymer layer is excellent.

Furthermore, with the production method for the metal oxide-polymer laminate of the present invention, a metal oxide-polymer laminate having excellent adhesive strength at the interface between the metal oxide layer and the polymer layer can be produced.

DETAILED DESCRIPTION OF THE INVENTION

Figure 1:
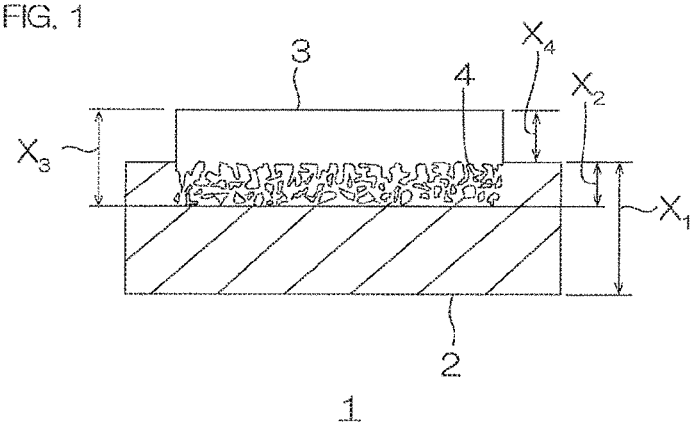
FIG. 1 is a cross sectional view of a metal oxide-polymer laminate in accordance with the present invention.

As shown in FIG. 1, a metal oxide-polymer laminate 1 in one embodiment of the present invention includes a polymer layer 2, and a metal oxide layer 3 laminated on one side of the polymer layer 2.

The polymer layer 2 is formed generally into a flat plate. The metal oxide layer 3 extends into the polymer layer 2 with an embedded portion 4. The embedded portion 4 is formed by metal oxide material being buried at various depths from the surface of the polymer layer 2 within the thickness direction. The exposed part (non-embedded) of oxide layer 3 is formed on top of the embedded area in a continuation of the deposition (coating) process.

Examples of materials that form the polymer layer 2 include thermoplastic resin and thermosetting resin. Preferably, thermoplastic resin is used.

Examples of the thermoplastic resin include olefin resins such as polyethylene and polypropylene; polyester resins such as polyethylene terephthalate (PET); fluorine resins such as polytetrafluoroethylene (tetrafluoroethylene resin, PTFE), a copolymer of tetrafluoroethylene and ethylene (ETFE), and a tetrafluoroethylene-perfluoroalkylvinylether copolymer (PFE); polyamide resins such as nylon; polyimide resins; polyvinyl chloride (PVC); silicone resin; and cellulose. Preferably, fluorine resins, and olefin resins are used. Of the fluorine resins, more preferably, polytetrafluoroethylene is used.

Examples of the thermosetting resin include epoxy resin, phenol resin, amino resin, and unsaturated polyester resin.

These can be used singly, or can be used in combination of two or more.

The polymer layer 2 may contain other organic compounds, for example, protein.

The polymer layer 2 may be formed from a single layer, or may be formed from multiple layers.

The polymer layer 2 is preferably a porous layer. Example of the porous layer include a porous membrane nonwoven fabric. When the polymer layer 2 is a porous layer, the metal oxide layer 3 can be embedded reliably by an AD method to be described later.

When the polymer layer 2 is nonwoven fabric, the production method is not particularly limited, and for example, can be produced by a dry method, wet method, spunbonding, thermal bonding, chemical bonding, stitch bonding, needle punching, melt blowing, spunlacing, steam jet method, and heat lamination method.

The polymer layer 2 has thickness $X_1$ of, for example, 1 μm or more, preferably 10 μm or more, more preferably 15 μm or more, and for example, 1000 μm or less, preferably 500 μm or less, more preferably 250 μm or less.

The embedded portion 4 has depth (that is, the length in up-down direction where the metal oxide layer 3 to be described later is embedded in the thickness direction) $X_2$ of, for example, 0.02 μm or more and 50 μm or less. In particular, when the polymer layer 2 is composed of fluorine resin, the embedded portion 4 depth, $X_2$, should be preferably 0.1 μm or more, more preferably 0.5 μm or more, and preferably 5 μm or less, more preferably 3 μm or less. When the polymer layer 2 is composed of olefin resin, preferably, depth $X_2$ is 3 μm or more, more preferably 12 μm or more, and preferably, 30 μm or less, more preferably 20 μm or less.

The metal oxide layer 3 is generally formed into a flat plate, and is laminated on one side in the thickness direction of the polymer layer 2. The metal oxide layer 3 is formed so as a portion is embedded/included in the polymer layer 2 when projected in the thickness direction.

The metal oxide layer 3 is formed from metal oxide particles (metal oxide powder) by an aerosol deposition method (AD method).

Examples of metals that form the metal oxide particles include zirconia (zirconium oxide), ceria (cerium oxide), alumina, yttria, tungsten oxide, and titanium oxide. Preferably, zirconia and ceria are used, and more preferably, zirconia is used.

For these metal oxide powders, known or commercially available ones can be used. To be specific, for the zirconia powder, for example, "RC-100" (manufactured by DAIICHI KIGENSO KAGAKU KOGYO CO., LTD.) and "TZ-3Y-E" (manufactured by Tosoh Corporation) are used. Examples of alumina powder include "AL-160SG-3", "AS-160SG-4", and "AL-45-A" (all trade names, manufactured by Showa Denko K.K.). Examples of yttria powder include "DTS-Y35" (manufactured by Fujimi Incorporated.).

These metal oxide powders may be used singly or in a combination of two or more.

The metal oxide particles used in the coating process may be primary (single) particles, or may be formed from aggregates (secondary particles) of primary particles.

Preferably, the metal oxide particles are formed from aggregates. This allows for excellent handleability, and reliable embedment of the metal oxide layer 3 in the polymer layer 2 by the AD method.

The primary particles of the metal oxide particles have an average particle size of, for example, 30 nm or more, preferably 50 nm or more, and for example, 500 nm or less, preferably 300 nm or less.

The average particle size of the primary particles of the metal oxide particles is measured by, for example, a scanning electron microscope (manufactured by Hitachi High-Technologies Corporation).

The aggregates (secondary particles) of metal oxide particles have an average particle size (median diameter) of, for example, 0.5 μm or more, preferably 2 μm or more, and for example, 10 μm or less, preferably 5 μm or less. When the aggregates have an average particle size of below the above-described lower limit, there may be a case where the metal oxide layer 3 cannot be embedded in the polymer layer 2 by the AD method. Meanwhile, when the aggregates have an average particle size of more than the above-described upper limit, the metal oxide particles sprayed by the AD method toward the polymer layer 2 may fail to form the metal oxide layer 3, and may destroy the polymer layer 2 due to excessively large kinetic energy of the impacting particle.

The average particle size (median diameter) of the metal oxide particles is measured with, for example, a scanning electron microscope (manufactured by Hitachi High-Technologies Corporation).

The metal oxide layer 3 may contain a known additive other than the metal oxide particles. Examples of the additive include polymer powder. For example, 1.0 mass % or less, preferably 0.5 mass % or less, even more preferably 0 mass % of the additive may be contained relative to the total amount of metal oxide particles and additive mixture. It is recommended that the metal oxide layer 3 is preferably formed only from metal oxide material.

Next, a production method of the metal oxide-polymer laminate 1 is described in detail.

For the formation of the metal oxide-polymer laminate, first, a polymer layer 2a is formed using known fabrication methods. At this point, no embedded portion 4 is present in the polymer layer 2a.

Next, in this method, an embedded portion 4 and the metal oxide layer 3 are formed in a single deposition step using deposition method (AD method) (formation step).

Figure 2:
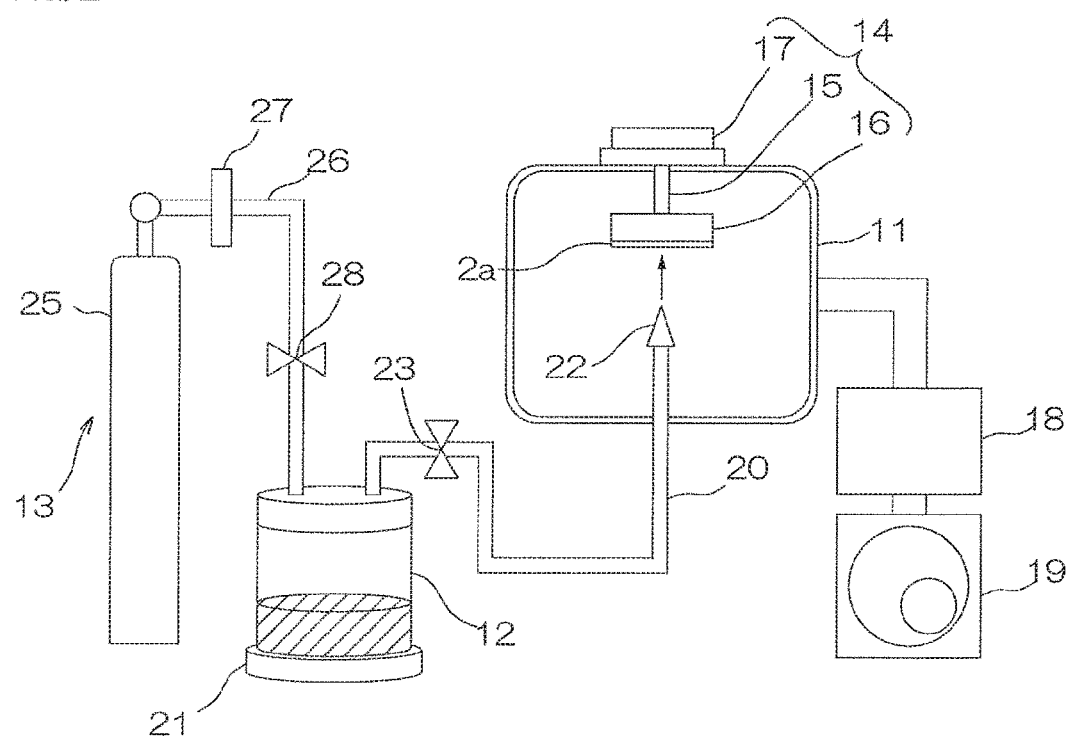
FIG. 2 is a schematic diagram illustrating the configuration of an aerosol deposition device used in a method for producing the metal oxide-polymer laminate shown in FIG. 1.

To form the metal oxide layer 3 with the embedded portion 4 by an aerosol deposition method (AD method-gas deposition method (vapor deposition method)), an aerosol deposition device 10 as shown in FIG. 2 is used.

The aerosol deposition device 10 includes a film-forming chamber 11, an aerosol generation chamber 12, and a carrier gas transportation device 13.

The film-forming chamber 11 is the chamber where the formation of the metal oxide layer 3 on the surface of the polymer layer 2a takes place, and includes a substrate holder 14, a thermometer (not shown) for measuring the temperature in the film-forming chamber 11, and a pressure gauge (not shown) for measuring the pressure in the film-forming chamber 11.

The substrate holder 14 includes a support 15, a mount 16, and a moving stage 17.

The support 15 is provided to allow connection of the mount 16 (kept at working pressure) and the moving stage 17 (kept at atmospheric pressure).

The mount 16 is provided for holding and fixing the polymer layer 2a in the film-forming chamber 11 for film-forming the oxidation layer coating step.

The stage 17 is provided so that the polymer layer 2a can be moved in any direction (x direction (front-back direction), y direction (left-right direction), z direction (up-down direction), and θ direction (rotational direction)) before or during the formation of the metal oxide layer 3.

In this fashion, the stage 17 is connected to the mount 16 through the support 15, and allows the mount 16 to be movable.

The film-forming chamber 11 is connected to a mechanical booster pump 18 and a rotary pump 19 for pressure adjustment purposes.

The mechanical booster pump 18 and the rotary pump 19 are sequentially connected to the film-forming chamber 11, so as to vacuum the film-forming chamber 11 as well as the aerosol chamber 12 that communicate with the film-forming chamber 11 through a connection pipe 20 (described later).

The aerosol chamber 12 is a storage tank that contains the material that will form the metal oxide layer 3 (that is, metal oxide particles), and includes a vibration device 21, and a pressure gauge (not shown) for measuring the pressure in the aerosol chamber 12.

The vibration device 21 is a device that causes vibration in the aerosol chamber 12, and in the metal oxide material powder contained in it. Any known shaker can be used as the vibration device 21.

A connection pipe 20 links the aerosol chamber 12 and the film-forming chamber 11.

The connection pipe 20 is a pipe for transporting the aerosolized material (hereinafter referred to as aerosol) from the aerosol chamber 12 to the film-forming chamber 11, and is disposed so that one end portion (upstream-side end portion) is connected to the aerosol chamber 12, and the other end portion penetrates the bottom wall of the film-forming chamber 11 and extends toward the mount 16. In the film-forming chamber 11, a film-forming nozzle 22 is connected to the end portion (downstream-side end portion) of the connection pipe 20.

The film-forming nozzle 22 is a spray device for spraying the aerosol to the surface of the polymer layer 2a, and it is disposed in the film-forming chamber 11 so that the spray port (slit) is facing the mount 16. To be specific, the film-forming nozzle 22 is disposed so that the spray port is located at a predetermined distance from the mount 16 (e.g., 1 mm or more, preferably 3 mm or more, and for example, 100 mm or less, preferably 50 mm or less). In this fashion, the aerosol supplied from the aerosol chamber 12 is sprayed on the surface of the polymer layer 2a.

The shape of the spray port (slit opening length) of the film-forming nozzle 22 is not particularly limited, and is set in accordance with, for example, the amount of aerosol to be sprayed and the spraying length or area.

A valve 23 is provided on the connection pipe 20. Examples of the connection pipe valve 23 include, for example, a known valve such as a solenoid valve.

The gas transportation device 13 includes a gas cylinder 25.

The gas cylinder 25 is a cylinder that contains a pressurized gas such as oxygen gas, helium gas, argon gas, nitrogen gas, or air; and is connected to the aerosol chamber 12 through the gas pipe 26.

The gas pipe 26 is a pipe for transporting carrier gas from the carrier gas cylinder 25 to the aerosol chamber 12, and its upstream-side end portion is connected to the carrier gas cylinder 25, while its downstream-side end portion is connected to the aerosol chamber 12.

A gas flowmeter 27 is installed on the gas pipe 26. The gas flowmeter 27 is a device for adjusting the flow rate of the gas in the gas pipe 26. Without particular limitation, a known flowmeter is used.

A gas pipe valve 28 is installed on the gas pipe 26 between the gas flowmeter 27 and the downstream side end portion of the gas pipe 26. For the gas pipe valve 28, for example, a known valve such as a solenoid valve is used.

To form the metal oxide layer 3 with the aerosol deposition device 10, first, the polymer layer 2a is disposed on the mount 16 so that the surface on which the metal oxide layer 3 is to be formed faces the film-forming nozzle 22 (lower side).

Meanwhile, the material (metal oxide particles, preferably, aggregates of metal oxide particles) of the metal oxide layer 3 as described above is introduced into the aerosol chamber 12.

The aggregates can be formed by heating the primary particles of the metal oxide particles for a predetermined time.

The heating temperature can be determined appropriately in accordance with, for example, the melting point and the primary particle size of the metal oxide, and is, for example, 700° C. or more and 1500° C. or less. Particularly, when zirconia is used for the metal oxide, the heating temperature is preferably 900° C. or more, more preferably 950° C. or more, even more preferably 1100° C. or more, and preferably 1300° C. or less, more preferably 1200° C. or less. Furthermore, when ceria is used for the metal oxide, the heating temperature is preferably 750° C. or more, more preferably 1000° C. or more, and preferably 1300° C. or less, more preferably 1200° C. or less.

The heating time is, for example, 0.1 hour or more, preferably 0.25 hour or more, and for example, 24 hours or less, preferably 1 hour or less.

By adjusting the heating conditions as described above, aggregates having a desired particle size can be obtained.

Next, in this method, the gas pipe valve 28 is closed and the connection pipe valve 23 is opened, and the mechanical booster pump 18 and the rotary pump 19 are driven, thereby vacuuming the film-forming chamber 11 and the aerosol chamber 12.

The pressure in the film-forming chamber 11 is, for example, 5 to 80 Pa, and the pressure in the aerosol chamber 12 is, for example, 5 to 80 Pa.

Next, in this method, the material of the metal oxide layer 3 is vibrated in the aerosol chamber 12 by the vibration device 21, the gas pipe valve 28 is opened, and the carrier gas is supplied to the aerosol chamber 12 from the carrier gas cylinder 25 through the flowmeter 27. In this manner, the material of the metal oxide layer 3 can be aerosolized, and the generated aerosol can be transported to the film-forming nozzle 22 through the connection pipe 20.

The flow rate of the carrier gas adjusted with the gas flowmeter 27 is, for example, 1 L/min or more, preferably 3 L/min or more, and for example, 20 L/min or less, preferably 18 L/min or less.

Next, in this method, the material is sprayed from the spray port of the film-forming nozzle 22 toward the surface of the polymer layer 2a.

The pressure inside the aerosol chamber 12 during the spraying of the aerosol is, for example, 50 Pa or more, preferably 1000 Pa or more, and for example, 80000 Pa or less, preferably 50000 Pa or less.

The pressure in the film-forming chamber 11 is, for example, 10 Pa or more, preferably 30 Pa or more, and for example, 1000 Pa or less, preferably 800 Pa or less.

The temperature in the aerosol chamber 12 during the spraying of the aerosol is, for example, 0 to 50° C.

During the spraying of the aerosol, preferably, the stage 17 is moved suitably so that the aerosol is sprayed to the surface of the polymer layer 2a evenly.

When moving the stage 17, the stage 17 is moved at a speed of (that is, the moving speed of the film-forming nozzle 22), for example, 0.1 mm/sec or more, preferably, 0.2 mm/sec or more, and for example, 100 mm/sec or less, preferably 20 mm/sec or less.

When the material is sprayed toward the surface of the polymer layer 2a, the material collides with the surface of the polymer layer 2a. The result of the collision is the formation of the embedded portion 4 in the polymer layer 2a. When the material is an aggregate, the aggregate once breaks up into primary particles at the time of the collision, and then the primary particles are embedded in the polymer layer 2a where the particles will consolidate, thereby forming the embedded portion 4 of the metal oxide layer 3. After creation of the embedded portion 4, the exposed part of the metal oxide layer 3 is formed onto the polymer layer 2a in a similar way as the embedded portion 4 but without the primary particles being subjected to an embedding process.

In this manner, the metal oxide layer 3 can be formed on the surface of the polymer layer 2 (lower side in the vertical direction). To be specific, a portion of the metal oxide layer 3 (one end portion in the thickness direction, to be specific, upper end portion) is embedded as embedded portion 4 in the polymer layer 2 in the thickness direction.

The metal oxide layer 3 has thickness $X_3$ of, for example, 0.1 μm or more and 50 μm or less. Particularly, when the polymer layer 2 on which the metal oxide layer 3 is laminated is fluorine resin, thickness $X_3$ is preferably 0.3 μm or more, more preferably 0.8 μm or more, and preferably 10 μm or less, more preferably 5 μm or less. When the polymer layer 2 is olefin resin, thickness $X_3$ is preferably 1 μm or more, more preferably 12 μm or more, and preferably 25 μm or less, more preferably 20 μm or less.

Thickness $X_4$ (that is, thickness deducting $X_2$ from $X_3$) at an exposure portion of the metal oxide layer 3 is, for example, 0.1 μm or more, preferably 0.3 μm or more, and for example, 20 μm or less, preferably 10 μm or less, more preferably less than 1.0 μm.

Thus, in the resulting metal oxide-polymer laminate 1, the metal oxide layer 3 is formed by the aerosol deposition method, and a portion of the metal oxide layer 3 is embedded in the polymer layer 2 in the thickness direction, and therefore the metal oxide layer 3 is laminated onto the polymer layer 2 firmly, and adherence between the metal oxide layer 3 and the polymer layer 2 is excellent. In this fashion, defects in the metal oxide-polymer laminate 1 are reduced, and thus the production yield can be improved. Due to the strong adherence between layers, the metal oxide-polymer laminate 1 has excellent durability.

The metal oxide-polymer laminate 1 can be used in various applications. For example, the metal oxide-polymer laminate 1 can be suitably used in applications such as substrates for electronic components, flexible electronic devices, electrooptic devices, sensor components, medical devices, and gas-liquid separation membranes.

Furthermore, by forming the metal oxide layer 3 on the polymer layer 2 using aggregates of the metal oxide particles by AD method, the aggregates provide strong impact force on the surface of the polymer layer 2, and thus modify the surface of the polymer layer 2 by etching and/or surface plastic deformation and elastic recovery of surface asperities, thereby reliably providing the embedded portion 4. The aggregates break up into primary particles during collision with the surface of the polymer layer 2, and thereafter, the primary particles are consolidated again to form the metal oxide layer 3. In this manner, a highly coherent metal oxide-polymer laminate 1 can be obtained.

In the embodiment of FIG. 1, a portion of the metal oxide layer 3 is embedded in the polymer layer 2 as embedded portion 4; however, for example, although not shown, the metal oxide layer 3 can be embedded entirely in the polymer layer 2 as embedded portion 4 as well.

In the embodiment of FIG. 1, although the metal oxide layer 3 is formed at the center portion of the polymer layer 2 when viewed from the top, for example, the metal oxide layer 3 can also be formed at an end edge portion of the polymer layer 2 when viewed from the top.

In the embodiment of FIG. 1, the metal oxide layer 3 is laminated only on one side of the polymer layer 2; however, although not shown, the metal oxide layer 3 can also be laminated on both sides (one side and the other side) of the polymer layer 2. The lamination of the oxide layer on both sides of the polymer layer 2 is achieved using the same approach as for one side (surface) lamination and the same results as those of the embodiment shown in FIG. 1 are achieved.

In the embodiment of FIG. 1, the polymer layer 2 is formed generally into a flat plate having a straight line; however, the polymer layer 2 can also be formed to have a curved shape (convex or concave in thickness direction).

These embodiments also achieve the same operations and effects as those of the embodiment shown in FIG. 1.

EXAMPLES

In the following text, the present invention is described in further detail with reference to Examples and Comparative Examples. The embodiments described below are not intended to limit the invention to the precise forms disclosed as examples. Rather, a purpose of these examples is to facilitate the appreciation and understanding by others skilled in the art of the principles and practices of the present invention. The numerical examples of which are shown below may be substituted to any value within the limits described in the above embodiments.

Example 1

A polytetrafluoroethylene resin porous film (PTFE: "TEMISH", 7 cm×7 cm, thickness 80 μm, manufactured by Nitto Denko Corporation) was prepared as a polymer layer 2a.

Then, the film (polymer layer 2a) was set on the mount 16 as indicated in FIG. 2. The temperature inside the film-forming chamber was 22° C. and the gas selected for the layer fabrication process was nitrogen gas.

The distance between the spray port of the nozzle 22 and the surface of the polymer layer 2a was adjusted to be 15 mm.

Meanwhile, zirconia powder (trade name "RC-100", average particle size of primary particles 0.2 μm, manufactured by DAIICHI KIGENSO KAGAKU KOGYO CO., LTD.) was heated at 1175° C. for 0.5 hours, thereby producing aggregates of zirconia powder (median diameter 2 μm). The median diameter of the aggregates of zirconia powder was measured with a scanning electron microscope (trade name "S-3400N", manufactured by Hitachi High-Technologies Corporation) at a magnification of 5000 times.

The aggregates were prepared in an amount of 50 g, and introduced into a 450 mL glass-made aerosol chamber.

Thereafter, the gas pipe valve was closed and the connection pipe valve was opened, and the mechanical booster pump and the rotary pump were driven, thereby reducing the pressure inside the film-forming chamber and the aerosol chamber to 50 Pa.

Then, the flow rate of the nitrogen gas was adjusted to be 6 L/min with the gas flowmeter 27, and, while shaking the aerosol chamber with a shaker, the gas pipe valve 23 was opened. In this manner, the zirconia powder was aerosolized in the aerosol chamber, and the obtained aerosol was sprayed from the nozzle.

The pressure in the film-forming chamber at this time was 250 Pa.

Then, the mount to which the polymer layer 2a was fixed was moved in x-y direction at a moving speed of 12 mm/sec, and the aerosol was sprayed toward the surface of the polymer layer 2a from the nozzle.

In this manner, as shown in FIG. 1, the metal oxide layer 3 (5 cm×5 cm, thickness 1.4 μm) was laminated on the surface of the polymer layer 2 so that a portion of the metal oxide layer 3 in the thickness direction was embedded into the polymer layer 2a, thereby producing a metal oxide-polymer laminate 1. Depth $X_2$ (length in up-down direction of the portion where the metal oxide layer 3 (zirconia layer) was embedded) of the embedded portion 4 was 0.9 μm.

Examples 2 to 4

Metal oxide-polymer laminates 1 were obtained in the same manner as in Example 1, except that the average particle size (median diameter) of the aggregates of zirconia powder was changed in accordance with Table 1.

In Example 2, the zirconia powder was heated at 1050° C. for 0.5 hours, thereby adjusting the average particle size of the aggregates of zirconia powder. In Example 3, the zirconia powder was heated at 1175° C. for 1 hour, thereby adjusting the average particle size of the aggregates. In Example 4, the zirconia powder was heated at 1175° C. for 3 hours, thereby adjusting the average particle size of the aggregates.

Example 5

A metal oxide-polymer laminate 1, in which a portion of the metal oxide layer 3 (5 cm×5 cm, thickness 20.6 μm) was embedded near the surface of the polymer layer 2a in the thickness direction, was obtained in the same manner as in Example 1, except that polypropylene nonwoven fabric (PP: trade name "HOP60HCF", manufactured by Nitto Denko Corporation, 7 cm×7 cm, thickness 200 μm, heat lamination method) was prepared as the polymer layer 2.

Examples 6 to 8

A metal oxide-polymer laminate 1 was obtained in the same manner as in Example 5, except that the average particle size (median diameter) of the aggregates of zirconia powder was changed in accordance with Table 2.

In Example 6, the zirconia powder was heated at 1050° C. for 0.5 hours, thereby adjusting the average particle size of the aggregates of zirconia powder. In Example 7, the zirconia powder was heated at 1175° C. for 1 hour, thereby adjusting the average particle size of the aggregates. In Example 8, the zirconia powder was heated at 1175° C. for 3 hours, thereby adjusting the average particle size of the aggregates.

Example 9

A metal oxide-polymer laminate 1, in which a portion of the metal oxide layer 3 (5 cm×5 cm, thickness 17 μm) was embedded near the surface of the polymer layer 2a in the thickness direction, was obtained in the same manner as in Example 5, except that ceria powder (average particle size of primary particle 50 nm) was heated at 800° C. for 3 hours, thereby producing aggregates of ceria powder (median diameter 3 μm) and that the aggregates were used.

Example 10

A metal oxide-polymer laminate 1 was obtained in the same manner as in Example 9, except that the average particle size of the aggregates of ceria powder (median diameter) was changed in accordance with Table 3. In Example 10, the ceria powder was heated at 1050° C. for 0.5 hours, thereby adjusting the average particle size of the aggregates of ceria powder.

Comparative Example 1

Zirconia powder formed from primary particles (average particle size 0.2 μm) in an amount of 10 g was dispersed in 44 g of a solvent (1-methyl-2-pyrrolidone), and polyvinylidene fluoride was added as a binder to be 2.5 mass % in the material after solvent removal, thereby preparing a zirconia dispersion liquid.

The zirconia dispersion liquid was laminated on the surface of a fluorinated ethylene resin porous film (same as the above-described one) by spin coating (150 rpm, 10 seconds), and dried at 90° C. for 1 day.

The metal oxide-polymer laminate 1 was obtained in this manner. The laminated metal oxide layer had a size of 2 cm×2 cm, and a thickness of 2.3 μm.

Comparative Example 2

The zirconia dispersion liquid was laminated on the surface of the fluorinated ethylene resin porous film by spin coating, and dried in the same manner as in Comparative Example 1, except that the zirconia powder formed from primary particles in the dispersion liquid was changed with zirconia powder formed from aggregates of primary particles (median diameter 2 μm) used in Example 1.

(Adherence Test)

The metal oxide-polymer laminates 1 of Examples and Comparative Examples were subjected to an ultrasonic cleaning to verify the integrity of the laminates. The ultrasonic cleaner was operated under room temperature (25° C.) for 3 minutes.

The mass of only the metal oxide layer 3 before and after the ultrasonic cleaning was measured, and the mass decrease rate of the metal oxide layer 3 after the ultrasonic cleaning procedure relative to the mass of the metal oxide layer 3 before the ultrasonic cleaning was calculated. The results are shown in Tables 1 to 3.

TABLE 1

| | | Example 1 | Example 2 | Example 3 | Example 4 |
|---|---|---|---|---|---|
| Metal Oxide Powder | Material | Zirconia | Zirconia | Zirconia | Zirconia |
| | Median Diameter (μm) | 2 | 1 | 5 | 8 |
| Polymer layer | Material | PTFE porous film | PTFE porous film | PTFE porous film | PTFE porous film |
| | Thickness $X_1$ (μm) | 80 | 80 | 80 | 80 |
| Metal oxide layer thickness $X_3$ (μm) | | 1.4 | 0.5 | 1.7 | 0.5 |
| Embedment portion depth $X_2$ (μm) | | 0.9 | 0.3 | 1.2 | 0.3 |
| Metal oxide layer exposure portion thickness $X_4$ (μm) | | 0.5 | 0.2 | 0.5 | 0.2 |
| Mass decrease rate (%) | | 0 | 3 | 0 | 3 |

TABLE 2

| | | Example 5 | Example 6 | Example 7 | Example 8 |
|---|---|---|---|---|---|
| Metal Oxide Powder | Material | Zirconia | Zirconia | Zirconia | Zirconia |
| | Median Diameter (μm) | 2 | 1 | 5 | 8 |
| Polymer layer | Material | PP nonwoven fabric | PP nonwoven fabric | PP nonwoven fabric | PP nonwoven fabric |

TABLE 2-continued

|  | Example 5 | Example 6 | Example 7 | Example 8 |
|---|---|---|---|---|
| Thickness $X_1$ (μm) | 200 | 200 | 200 | 200 |
| Metal oxide layer thickness $X_3$ (μm) | 20.6 | 10.2 | 20.6 | 10.2 |
| Embedment portion depth $X_2$ (μm) | 20 | 10 | 20 | 10 |
| Metal oxide layer exposure portion thickness $X_4$ (μm) | 0.6 | 0.2 | 0.6 | 0.2 |
| Mass decrease rate (%) | 0 | 3 | 0 | 3 |

TABLE 3

| | | Example 9 | Example 10 | Comparative Ex. 1 | Comparative Ex. 2 |
|---|---|---|---|---|---|
| Metal Oxide Powder | Material | Ceria | Ceria | Zirconia | Zirconia |
| | Median Diameter (μm) | 3 | 8 | 0.2 | 2 |
| Polymer layer | Material | PP nonwoven fabric | PP nonwoven fabric | PTFE porous film | PTFE porous film |
| | Thickness $X_1$ (μm) | 200 | 200 | 80 | 80 |
| Metal oxide layer thickness $X_3$ (μm) | | 17 | 14.7 | 2.3 | 20 |
| Embedment portion depth $X_2$ (μm) | | 16 | 14 | 0.3 | 0 |
| Metal oxide layer exposure portion thickness $X_4$ (μm) | | 1.0 | 0.7 | 2.0 | 20 |
| Mass decrease rate (%) | | 3 | 0 | 80 | 95 |

As will be understood by those familiar with the art, the descriptions and disclosures therein are intended for illustrative purpose only and not limiting in any manner the scope of the invention. Modifications and variations of the present invention that will be obvious to those skilled in the art are to be covered by the following claims.

What is claimed is:

1. A method for producing a metal oxide-polymer laminate, the method comprising:
    preparing a polymer layer, and
    forming a metal oxide layer on a surface of the polymer layer by an aerosol deposition method so that at least a portion of the metal oxide layer is embedded in the polymer layer in a thickness direction thereof, wherein
    in the aerosol deposition method, a material of the metal oxide layer is aerosolized by vibrating the material of the metal oxide layer in a chamber and supplying a carrier gas to the chamber, and the aerosolized material of the metal oxide layer is sprayed from a nozzle, and
    the metal oxide layer has a thickness of 0.1 μm or more and 50 μm or less.

2. The method for producing a metal oxide-polymer laminate according to claim 1, wherein the polymer layer is a porous layer.

3. The method for producing a metal oxide-polymer laminate according to claim 1, wherein the material of the metal oxide layer is an aggregate of metal oxide particles.

4. The method for producing a metal oxide-polymer laminate according to claim 3, wherein the aggregate of metal oxide particles has a median diameter of 0.5 μm or more and 10 μm or less.

5. The method for producing a metal oxide-polymer laminate according to claim 3, further comprising heating primary particles of the metal oxide particles to form the aggregate of the metal oxide particles.

* * * * *